United States Patent
Hishioka

(10) Patent No.: US 8,278,768 B2
(45) Date of Patent: Oct. 2, 2012

(54) SEMICONDUCTOR DEVICE INCLUDING WIRES CONNECTING ELECTRODES TO AN INNER LEAD

(75) Inventor: Maiko Hishioka, Osaka (JP)

(73) Assignee: Panasonic Corporation, Osaka (JP)

( * ) Notice: Subject to any disclaimer, the term of this patent is extended or adjusted under 35 U.S.C. 154(b) by 298 days.

(21) Appl. No.: 12/687,531

(22) Filed: Jan. 14, 2010

(65) Prior Publication Data

US 2010/0176500 A1 Jul. 15, 2010

(30) Foreign Application Priority Data

Jan. 15, 2009 (JP) ................................. 2009-006987
Aug. 28, 2009 (JP) ................................. 2009-198116

(51) Int. Cl.
*H01L 23/48* (2006.01)
*H01L 23/52* (2006.01)
*H01L 29/40* (2006.01)
(52) U.S. Cl. ................. 257/784; 257/777; 257/E23.024
(58) Field of Classification Search .................. 257/784, 257/777, E23.024
See application file for complete search history.

(56) References Cited

U.S. PATENT DOCUMENTS

| 6,031,281 | A * | 2/2000 | Kang et al. ..................... 257/692 |
| 6,161,753 | A * | 12/2000 | Tsai et al. ...................... 228/180.5 |
| 6,372,625 | B1 * | 4/2002 | Shigeno et al. ................ 438/617 |
| 6,376,919 | B1 * | 4/2002 | Li et al. ......................... 257/778 |
| 6,380,634 | B1 * | 4/2002 | Umehara ....................... 257/784 |
| 6,476,506 | B1 * | 11/2002 | O'Connor et al. ............ 257/786 |
| 6,650,013 | B2 * | 11/2003 | Yin et al. ....................... 257/736 |
| 6,713,849 | B2 * | 3/2004 | Hasebe et al. ................. 257/667 |
| 6,900,551 | B2 * | 5/2005 | Matsuzawa et al. .......... 257/786 |
| 7,285,854 | B2 * | 10/2007 | Ishikawa et al. .............. 257/738 |
| 2001/0054759 | A1 | 12/2001 | Nishiura |
| 2002/0084518 | A1 * | 7/2002 | Hasebe et al. ................ 257/676 |
| 2003/0042622 | A1 | 3/2003 | Horibe |
| 2003/0052394 | A1 | 3/2003 | Aga et al. |
| 2004/0061202 | A1 * | 4/2004 | Shim et al. .................... 257/666 |
| 2005/0029679 | A1 * | 2/2005 | Horibe .......................... 257/784 |
| 2008/0088012 | A1 | 4/2008 | Ohkawa |
| 2008/0116591 | A1 * | 5/2008 | Hayashi et al. ............... 257/784 |

FOREIGN PATENT DOCUMENTS

| JP | 2001-345339 | | 12/2001 |
| JP | 2003-068782 | | 3/2003 |
| JP | 2003-086622 | | 3/2003 |
| JP | 2008-047679 | | 2/2008 |
| JP | 2010186980 | A * | 8/2010 |

* cited by examiner

*Primary Examiner* — Teresa M Arroyo
(74) *Attorney, Agent, or Firm* — McDermott Will & Emery LLP

(57) ABSTRACT

A semiconductor device includes a plurality of electrodes formed on a semiconductor chip, and a plurality of wires each connecting each of the electrodes to an inner lead, and each having a plurality of bending points. A first wire of the plurality of wires has a slope extending upwardly from a first bending point toward a second bending point, where the first bending point is being located at an upper end of a rising portion. The second bending point of the first wire is the highest bending point in the first wire. A second wire of the plurality of wires has a slope extending downwardly from a first bending point toward a second bending point, where the first bending point is located at an upper end of a rising portion. The second bending point of the second wire is the lowest bending point in the second wire.

16 Claims, 10 Drawing Sheets

SEMICONDUCTOR DEVICE INCLUDING WIRES CONNECTING ELECTRODES TO AN INNER LEAD

CROSS-REFERENCE TO RELATED APPLICATION

This application claims priority to Japanese Patent Application No. 2009-6987 filed on Jan. 15, 2009, and Japanese Patent Application No. 2009-198116 filed on Aug. 28, 2009, the disclosures of which including the specification, the drawings, and the claims are hereby incorporated by reference in its entirety.

BACKGROUND

The present disclosure relates to a semiconductor device, and more particularly to a semiconductor device including a plurality of fine metal wires connecting electrodes on a semiconductor chip to inner leads.

In recent years, electronic devices, such as mobile phones, DVD recorders/players, digital televisions, and car navigation systems, have achieved miniaturization, enhanced performance, and a larger number of functions. With this trend, the semiconductor device industry has required packaging technology which enables a high pin count, a small size, high density, and a reduced cost. Even when electrodes arranged at a finer pitch are connected to inner leads through fine metal wires during an assembly process, and as a result, the fine metal wires are deformed due to injection of a resin encapsulant during an encapsulation process, semiconductor devices enabling a reduced pitch can be manufactured at a low cost as long as the pitch between the adjacent fine metal wires can be maintained sufficiently large.

For example, Japanese Patent Publication No. 2001-345339 teaches a semiconductor device in which, to address this problem, a plurality of semiconductor chips are mounted in a stacked configuration on an island of a lead frame, and pins provided on the semiconductor chips are connected to inner leads of the lead frame through fine metal wires.

A conventional semiconductor device will be described with reference to the drawings.

FIG. 9 illustrates a cross-sectional view showing a part of a structure in which electrodes on a plurality of semiconductor chips are electrically connected to inner leads, and FIG. 10 illustrates a plan view showing a part of a structure in which the electrodes on the semiconductor chips are electrically connected to the inner leads through fine metal wires.

FIG. 9 shows a structure in which semiconductor chips 105A, 105B, and 105C are sequentially stacked on an island 102 of a lead frame 103, and first bond points 107A, 107B, and 107C respectively on electrodes of the semiconductor chips 105A, 105B, and 105C are respectively connected to second bond points 111A, 111B, and 111C on an inner lead 101 through fine metal wires 108, 109, and 110.

The conventional fine metal wires have trapezoidal shapes (bend shapes), which are trapezoidal portions 108$b$, 109$b$, and 110$b$, respectively continuous from first bending points 108$a$, 109$a$, and 110$a$. The fine metal wires except the upper fine metal wire 110 further respectively include third bending points 108$e$ and 109$e$ formed in slope potions following the second bend portions 108$c$ and 109$c$, slope portions 108$d$ and 109$d$ located adjacent to the trapezoidal portions, and slope portions 108$f$ and 109$f$ located adjacent to the inner leads.

SUMMARY

However, the conventional semiconductor device has the following problems.

Although the structure of the conventional fine metal wires maintains a sufficient interval between a slope portion of an upper fine metal wire, and a slope portion of a lower fine metal wire, an effect occurring in encapsulation using a resin encapsulant is not considered in the structure. It is difficult to maintain the interval between the fine metal wires after the encapsulation. In addition, there are some problems that, for example, sides of the trapezoidal portions, each of which is located between the first bending point and the second bending point, do not have enough intervals between the fine metal wires, and the fine metal wires may come into contact with one another.

In view of the problems set forth above, the present invention has an object to achieve a semiconductor device preventing the metal wires, which is applicable to a pitch reduction, from coming into contact with one another, expanding the range of conditions underwhich encapsulation of a resin encapsulant is performed, and preventing the metal wires from being exposed on a package surface made of a resin encapsulant.

To accomplish the above object, a semiconductor device of the present invention has a structure in which a first wire and a second wire, each of which connects an electrode on a semiconductor chip to an inner lead of a lead frame, have different bend shapes from each other.

Specifically, the semiconductor device of the present invention includes a lead frame having an island and inner leads, a semiconductor chips secured on the island, and a plurality of electrodes formed on the semiconductor chip, a plurality of wires each connecting each of the electrodes to the inner lead, and each having a plurality of bending points. A first wire of the plurality of the wires has a slope extending upwardly from a first bending point toward a second bending point, where the first bending point is being located at an upper end of a rising portion rising upwardly from a first connecting point on the electrode. The second bending point of the first wire is the highest bending point in the first wire. A second wire of the plurality of the wires has a slope extending downwardly from a first bending point toward a second bending point, where the first bending point is located at an upper end of a rising portion rising upwardly from a first connecting point on the electrode. The second bending point of the second wire is the lowest bending point in the second wire.

According to the present invention, the first wire has the slope extending upwardly from the first bending point toward the second bending point, where the first bending point is located at the upper end of the rising portion rising upwardly from the first connecting point on the electrode, whereas, the second wire has the slope extending downwardly from the first bending point toward the second bending point, where the first bending point is located at the upper end of the rising portion rising upwardly from the first connecting point on the electrode. Therefore, the wires have bend shapes so that the interval between the wires is extended. This prevents the wires from coming into contact with each other due to the deformation of the wires caused by an encapsulation of a resin encapsulant. Therefore, this prevents the rising portion from being higher, thereby preventing the wires from being exposed on a package surface. Also, it is possible to expand a range of a condition underwhich the encapsulation of the resin encapsulant can be performed or relax requirements of the condition.

In the semiconductor device of the present invention, it is preferable that the second bending point of the first wire is located at a position nearer the semiconductor chip than a position representing about 50% of a distance between the first connecting point of the first wire and a second connecting point where the first wire is connected to the inner lead, and the second bending point of the second wire is located at a position nearer the semiconductor chip than a position representing about 50% of a distance between the first connecting point of the second wire and a second connecting point where the second wire is connected to the inner lead.

In the semiconductor device of the present invention, it is preferable that the first wire has a third bending point located between the second bending point and the second connecting point.

In the semiconductor device of the present invention, it is preferable that the second wire has a middle bending point located between the second bending point and the first connecting point.

In the semiconductor device of the present invention, it is preferable that the first wire has a third bending point located between the second bending point and the second connecting point, and the second wire has a middle bending point located between the second bending point and the first connecting point. An inclination angle of a portion formed between the second bending point and the third bending point of the first wire is smaller than an inclination angle of a portion formed between the middle bending point and the second bending point of the second wire.

In the semiconductor device of the present invention, it is preferable that a height of the first connecting point is configured to be the same as or larger than that of the second connecting point, and an inclination angle of a portion formed between the second bending point and the second connecting point of the first wire is larger than that of a portion formed between the second bending point and the second connecting point of the second wire.

In the semiconductor device of the present invention, it is preferable that a height of the first connecting point is configured to be smaller than that of the second connecting point, the first wire extends downwardly from the second bending point toward the second connecting point, and the second wire extends upwardly from the second bending point toward the second connecting point.

In the semiconductor device of the present invention, it is preferable that at least one pair of the first and second wires of the plurality of the wires are located so as to be adjacent to each other.

In the semiconductor device of the present invention, it is preferable that the upper end of the rising portion rising from the first connecting point in the first wire is higher than or the same as the upper end of the rising portion rising from the first connecting point in the second wire.

In the semiconductor device of the present invention, it is preferable that the semiconductor device includes multiple ones of the semiconductor chip, and the first wire and the second wire are respectively connected to different ones of the multiple ones of the semiconductor chip.

In the semiconductor device of the present invention, it is preferable that at least three types of wires each having different bending shapes connect the semiconductor chip to the inner lead, a third wire of the three types of the wires that is located above the first wire extends upwardly from a first bending point toward a second bending point, where the first bending point is being located at an upper end of a rising portion rising upwardly from a first connecting point on the electrode. It is preferable that the second bending point of the third wire is located at a position nearer the semiconductor chip than a position representing about 50% of a distance between the first connecting point and a second connecting point of the third wire, the second bending point of the third wire is the highest bending point in the third wire, and the second bending point of the third wire is located at a position nearer the inner lead than the second bending point of the first wire.

In this case, it is preferable that the semiconductor device includes multiple ones of the semiconductor chip, and the first wire and the second wire are respectively connected to different ones of the multiple ones of the semiconductor chip.

As stated above, the semiconductor device of the present invention can prevent the interval between the adjacent wires adjacent to each other from increasing, and prevent the rising portion from being higher. Therefore, a pitch reduction of the semiconductor chips can be achieved in the semiconductor device, and the device is less likely to be affected by a resin encapsulant, thereby expanding the range of a condition under which encapsulation of a resin encapsulant can be performed and preventing the wires from being exposed on a package surface.

BRIEF DESCRIPTION OF THE DRAWINGS

FIG. 3A illustrates the simulation result in a center portion of the chip, and FIG. 3B illustrates the simulation result in a corner portion of the chip.

DETAILED DESCRIPTION

First Example Embodiment

A semiconductor device according to a first example embodiment will be described with reference to FIG. 1.

Figure 1:
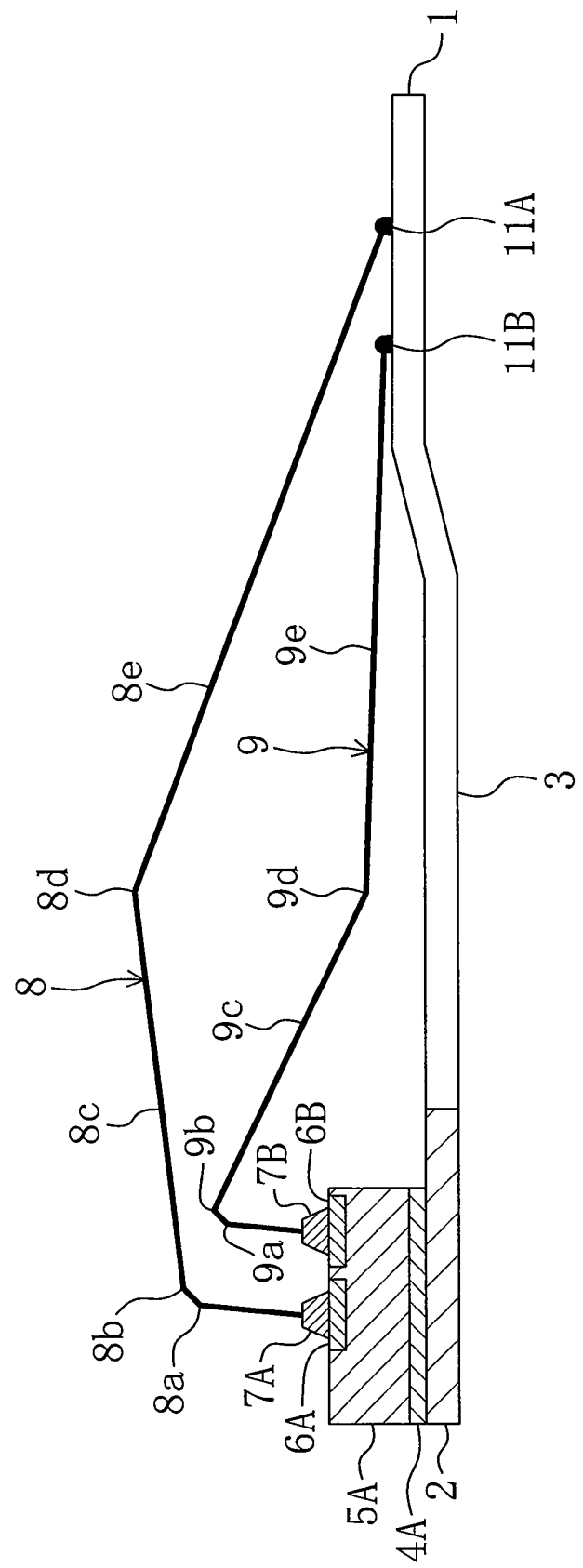
FIG. 1 is a cross-sectional view of a semiconductor device according to a first example embodiment.

FIG. 1 illustrates a cross-sectional structure of the semiconductor device according to the first example embodiment.

As shown in FIG. 1, a first semiconductor chip 5A is secured through a dice bond material 4A on an island 2 in a lead frame 3 having inner leads 1 and the island 2. A first electrode 6A and a second electrode 6B formed on an upper surface of the first semiconductor chip 5A are connected to the inner leads 1 by a first fine metal wire 8 and a second fine metal wire 9 adjacent to each other and having different bend shapes.

The first fine metal wire 8 has a slope portion 8c extending gradually upwardly toward a second bending point 8d from a first bending point 8b of a rising portion 8a rising upwardly and vertically from a first bond point 7A where the first fine metal wire 8 is connected to the first electrode 6A on the first semiconductor chip 5A. The slope portion 8c may not have a straight shape. The second bending point 8d is located at a position nearer the first semiconductor chip 5A than a position representing about 50% of a distance between the first bond point 7A and a second bond point 11A where the first fine metal wire 8 is connected to the inner lead 1, and the second bending point 8d is the highest bending point in the first fine metal wire 8. The first fine metal wire 8 also has a slope portion 8e extending gradually downwardly from the second bending point 8d toward the second bond point 11A.

The second fine metal wire 9 has a slope portion 9c extending gradually upwardly toward a second bending point 9d from a first bending point 9b of a rising portion 9a rising upwardly and vertically from a first bond point 7B where the second fine metal wire 9 is connected to the second electrode 6B on the first semiconductor chip 5A. The slope portion 9c may not have a straight shape. The second bending point 9d is located at a position nearer the first semiconductor chip 5A than a position representing about 50% of a distance between the first bond point 7B and a second bond point 11B where the second fine metal wire 9 is connected to the inner lead 1, and the second bending point 9d is the lowest bending point in the second fine metal wire 9.

Figure 2:
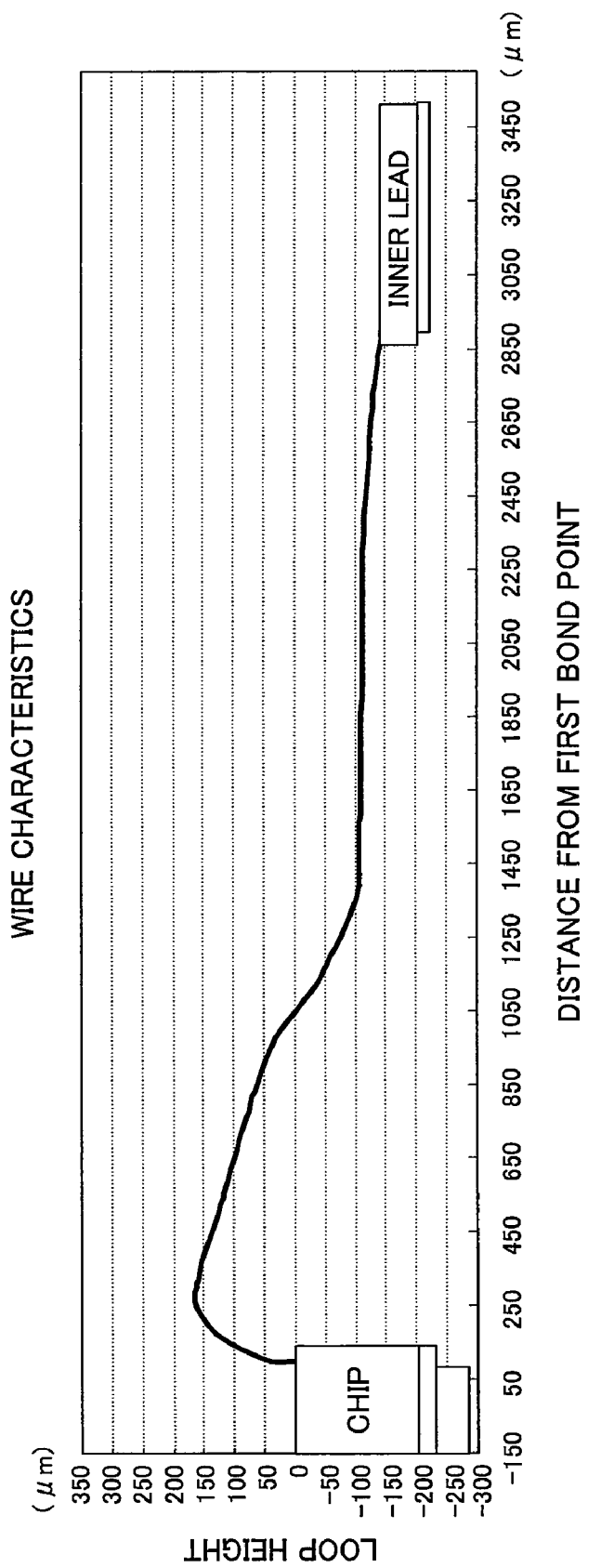
FIG. 2 is a graph showing characteristics of wires that connect chips to inner leads in the semiconductor device according to the first example embodiment.
Figure 3A:
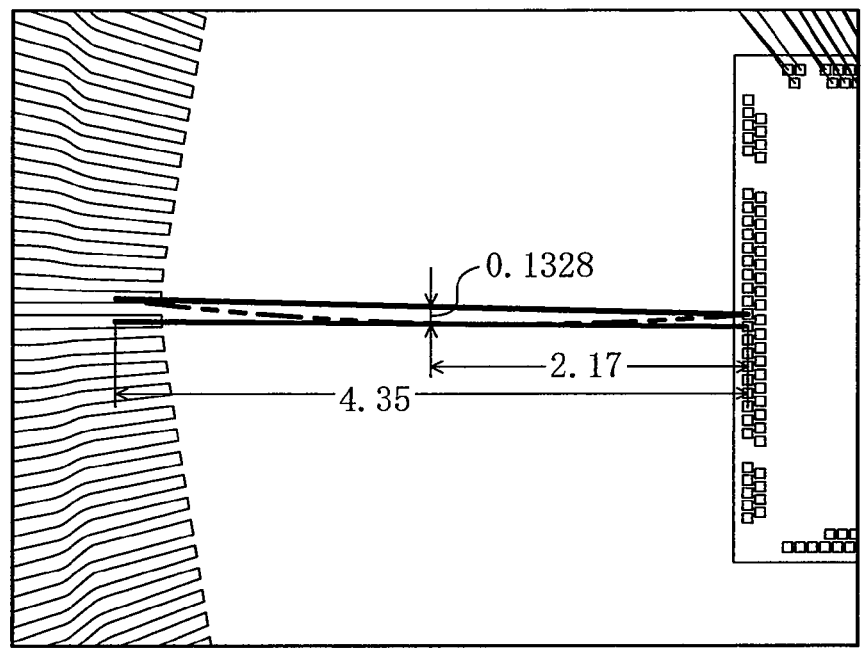
FIGS. 3A and 3B illustrate simulation results of contact positions of wires located adjacent to each other in the semiconductor device according to the first example embodiment.
Figure 3B:
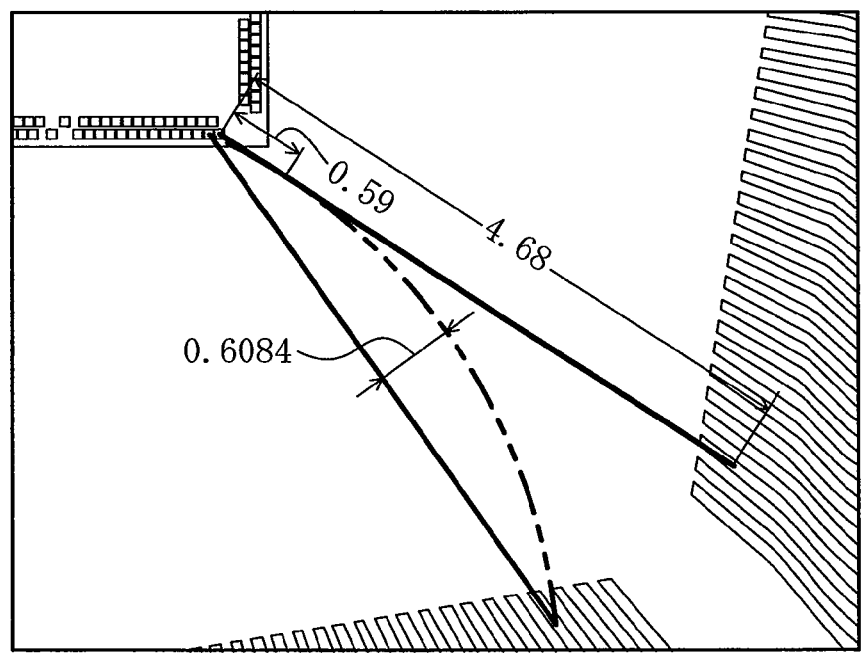

The reason why the second bending point 8d of the first fine metal wire 8 and the second bending point 9d of the second fine metal wire 9 are located at a position representing the aforementioned 50% will be described with reference to FIGS. 2, 3A, and 3B. FIGS. 3A and 3B illustrate results of a simulation carried out, by using a wire of FIG. 2 having wire characteristics, to find out a position where the two adjacent wires connecting a chip to inner leads are in contact with each other. As shown in FIG. 3A, when one of adjacent wires is swept at the center portion of the chip, the wires come into contact with each other at a position representing 49.8% of the length of the wires measured from the bond point on the chip. As shown in FIG. 3B, when one of adjacent wires is swept at a corner portion of the chip, the wires come into contact with each other at a position representing 12.6% of the length of the wires measured from the bond point on a chip. These simulation results confirms that the adjacent wires are deformed due to a resin encapsulant or the like, thereby causing the adjacent wires to come into contact with each other at positions ranging from 12.6% to 49.8% of the length of the wire measured from the bond point on the chip. Therefore, it is preferable that the second bending points 8d and 9d are respectively located near the first semiconductor chip 5A and at positions ranging from about 13% to 50% of the distances between the first bond points 7A and 7B, and the second bond points 11A and 11B.

The second fine metal wire 9 also has a slope portion 9e extending gradually downwardly from the second bending point 9d toward the second bond point 11B.

Heights of the first bond points 7A and 7B are larger than those of the second bond points 11A and 11B, and an inclination angle of the slope portion 8e formed between the second bending point 8d and the second bond point 11A in the first fine metal wire 8 is larger than that of the slope portion 9e formed between the second bending point 9d and the second bond point 11B of the second fine metal wire 9.

A height of the rising portion 8a in the first fine metal wire 8 is larger than that of the rising portion 9a in the second fine metal wire 9.

The above configuration of the semiconductor device maintains the sufficient interval between the first fine metal wire 8 and the second fine metal wire 9 adjacent to each other, thereby preventing the first fine metal wire 8 and the second fine metal wire 9 from coming into contact with each other after a step of encapsulation. Also, the height of the rising portion 8a of the first fine metal wire 8 can be reduced, and the entire height of the first fine metal wire 8 is reduced. Thus, such a configuration can reduce variations of the heights of the bending portions of the first fine metal wire 8, and increase a distance from the uppermost fine metal wire to a surface of a package of an encapsulant (not shown). This allows the metal wires to be less likely to be exposed on the package surface, thereby achieving a semiconductor device having a high quality and providing flexibility in design.

First Modified Example of First Example Embodiment

A semiconductor device according to a first modified example of the first example embodiment will be described with reference to FIG. 4.

Figure 4:
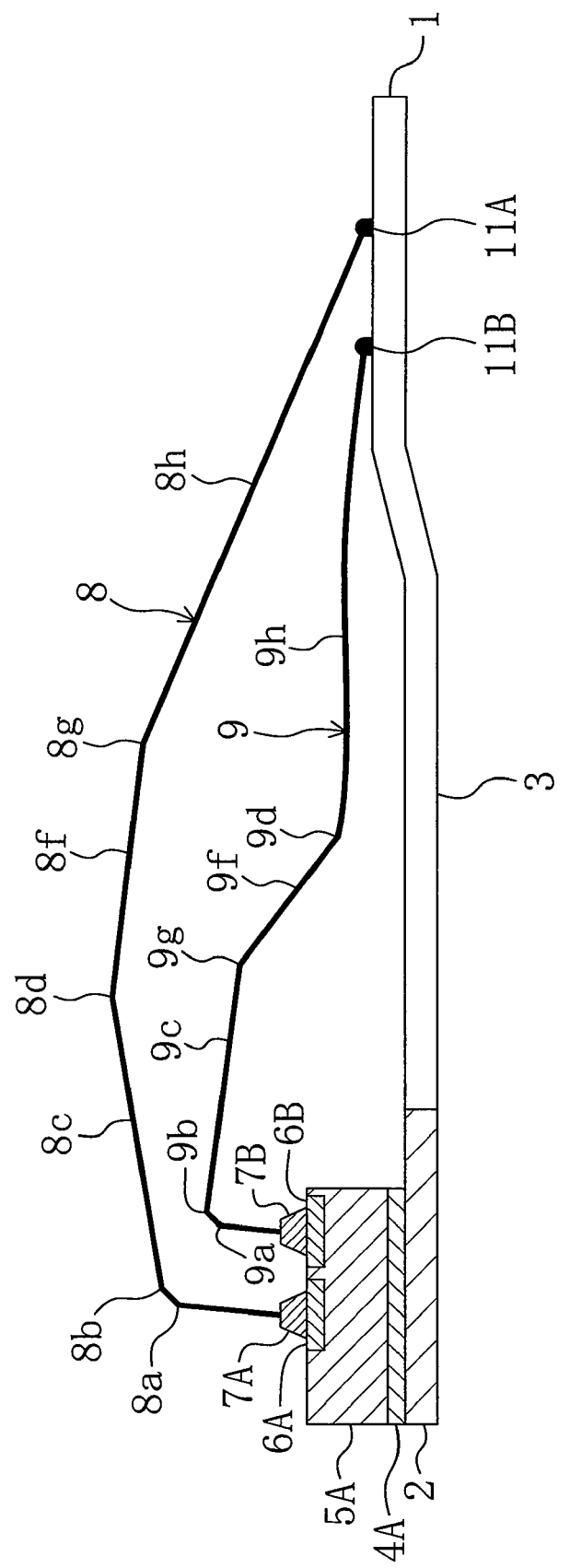
FIG. 4 is a cross-sectional view of a semiconductor device according to a first modified example of the first example embodiment.

FIG. 4 illustrates a cross-sectional structure of the semiconductor device according to the first modified example of the first example embodiment. In FIG. 4, the same reference characters as those shown in FIG. 1 have been used to designate identical elements, and explanation thereof will be omitted.

Differences from the first example embodiment will be described as follows.

As shown in FIG. 4, the first fine metal wire 8 has a third bending point 8g between the second bending point 8d and the second bond point 11A, and the third bending point 8g is located at a position lower than the second bending point 8d. A slope portion 8f extending from the second bending point 8d to the third bending point 8g may not have a straight shape. Aside from the third bending point 8g, other multiple bending points may be further included. Furthermore, the first fine metal wire 8 has a slope extending from the third bending point 8g toward the second bond point 11A.

The second fine metal wire 9 has a middle bending point 9g between the first bending point 9d and the second bending point 9d, and the middle bending point 9g is located at a position higher than the second bending point 9d, and lower than the first bending point 9b. A slope portion 9f extending from the middle bending point 9g to the second bending point 9d may not have a straight shape. Furthermore, the second fine metal wire 9 has a slope extending from the second bending point 9d toward the second bond point 11B. Aside from the third bending point 9g, other multiple bending points may be further included.

Heights of the first bond points 7A and 7B are larger than those of the second bond points 11A and 11B, and an inclination angle of a slope portion 8h formed between the third bending point 8g and the second bond point 11A in the first fine metal wire 8 is larger than that of a slope portion 9h formed between the second bending point 9d and the second bond point 11B in the second fine metal wire 9, and an inclination angle of a slope portion 8f formed between the second bending point 8d and the third bending point 8g in the first fine metal wire 8 is larger than that of a slope portion 9f formed between the middle bending point 9g and the second bending point 9d in the second fine metal wire 9.

A height of the rising portion 8a in the first fine metal wire 8 is larger than that of the rising portion 9a in the second fine metal wire 9.

The above configuration of the semiconductor device maintains the sufficient interval between the first fine metal wire 8 and the second fine metal wire 9 adjacent to each other, thereby preventing the first fine metal wire 8 and the second fine metal wire 9 from coming into contact with each other after a step of encapsulation. Also, the height of the rising portion 8*a* of the first fine metal wire 8 can be reduced, and the entire height of the first fine metal wire 8 is reduced. Thus, such a configuration can reduce variations of the heights of the bending portions of the first fine metal wire 8, and increase a distance from the uppermost fine metal wire to a surface of a package of an encapsulant (not shown). This allows the metal wires to be less likely to be exposed on the package surface, thereby achieving a semiconductor device having a high quality and providing flexibility in design.

Second Modified Example of First Example Embodiment

A semiconductor device according to a second modified example of the first example embodiment will be described with reference to FIG. 5.

Figure 5:
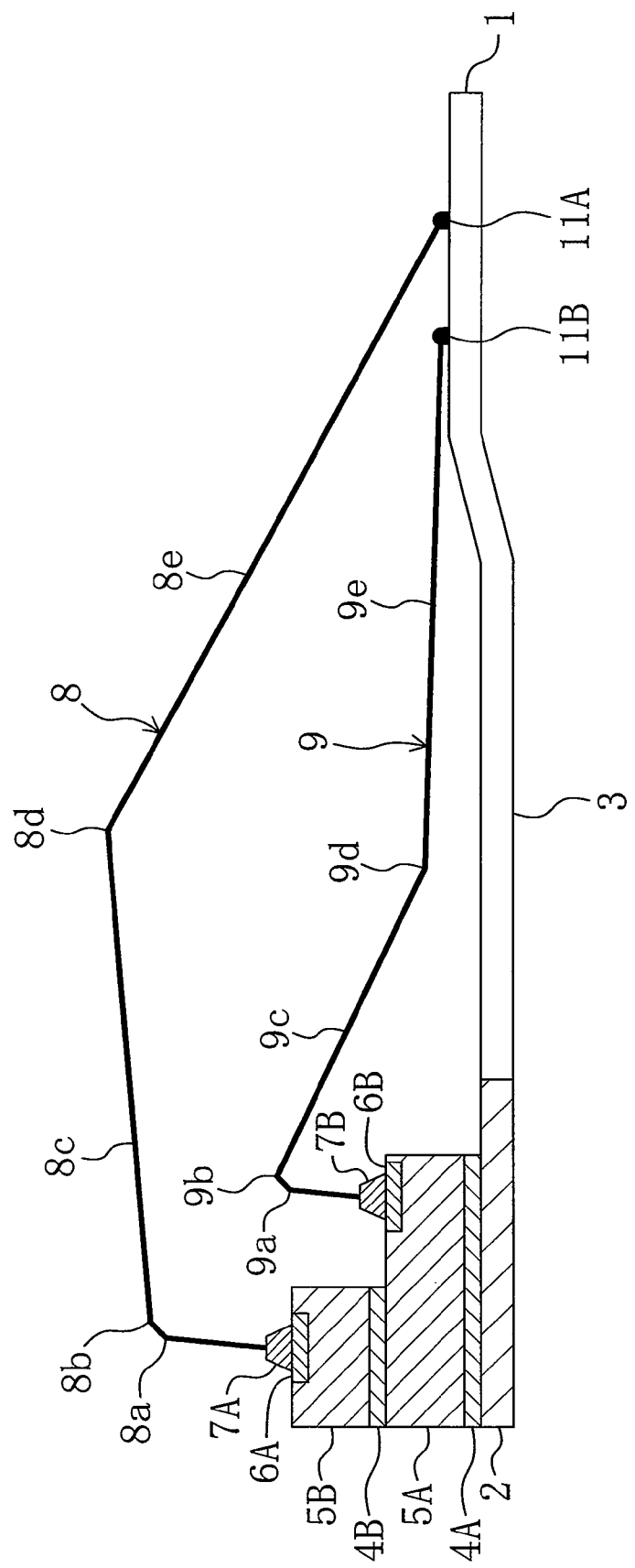
FIG. 5 is a cross-sectional view of a semiconductor device according to a second modified example of the first example embodiment.

FIG. 5 illustrates a cross-sectional structure of the semiconductor device according to the second modified example of the first example embodiment. In FIG. 5, the same reference characters as those shown in FIG. 1 have been used to designate identical elements, and explanation thereof will be omitted.

Differences from the first example embodiment will be described as follows.

As shown in FIG. 5, the first semiconductor chip 5A is secured through the dice bond material 4A on the island 2 in the lead frame 3 having the inner leads 1 and the island 2. The second electrode 6B formed on the upper surface of the first semiconductor chip 5A is connected to the inner lead 1 by the second fine metal wire 9. A second semiconductor chip 5B is secured through a dice bond material 4B on the upper surface of the first semiconductor chip 5A. The first electrode 6A formed on an upper surface of the second semiconductor chip 5B is connected to the inner lead 1 by the first fine metal wire 8.

A height of the rising portion 8*a* in the first fine metal wire 8 is larger than that of the rising portion 9*a* in the second fine metal wire 9.

The above configuration of the semiconductor device maintain the sufficient interval between the first fine metal wire 8 and the second fine metal wire 9 adjacent to each other, thereby preventing the first fine metal wire 8 and the second fine metal wire 9 from coming into contact with each other after a step of encapsulation. Also, the height of the rising portion 8*a* of the first fine metal wire 8 can be reduced, and the entire height of the first fine metal wire 8 is reduced. Thus, such a configuration can reduce variations of the heights of the bending portions of the first fine metal wire 8, and increase a distance from the uppermost fine metal wire to a surface of a package of an encapsulant (not shown). This allows the metal wires to be less likely to be exposed on the package surface, thereby achieving a semiconductor device having a high quality and providing flexibility in design.

Second Example Embodiment

A semiconductor device according to a second example embodiment will be described with reference to FIG. 6.

Figure 6:
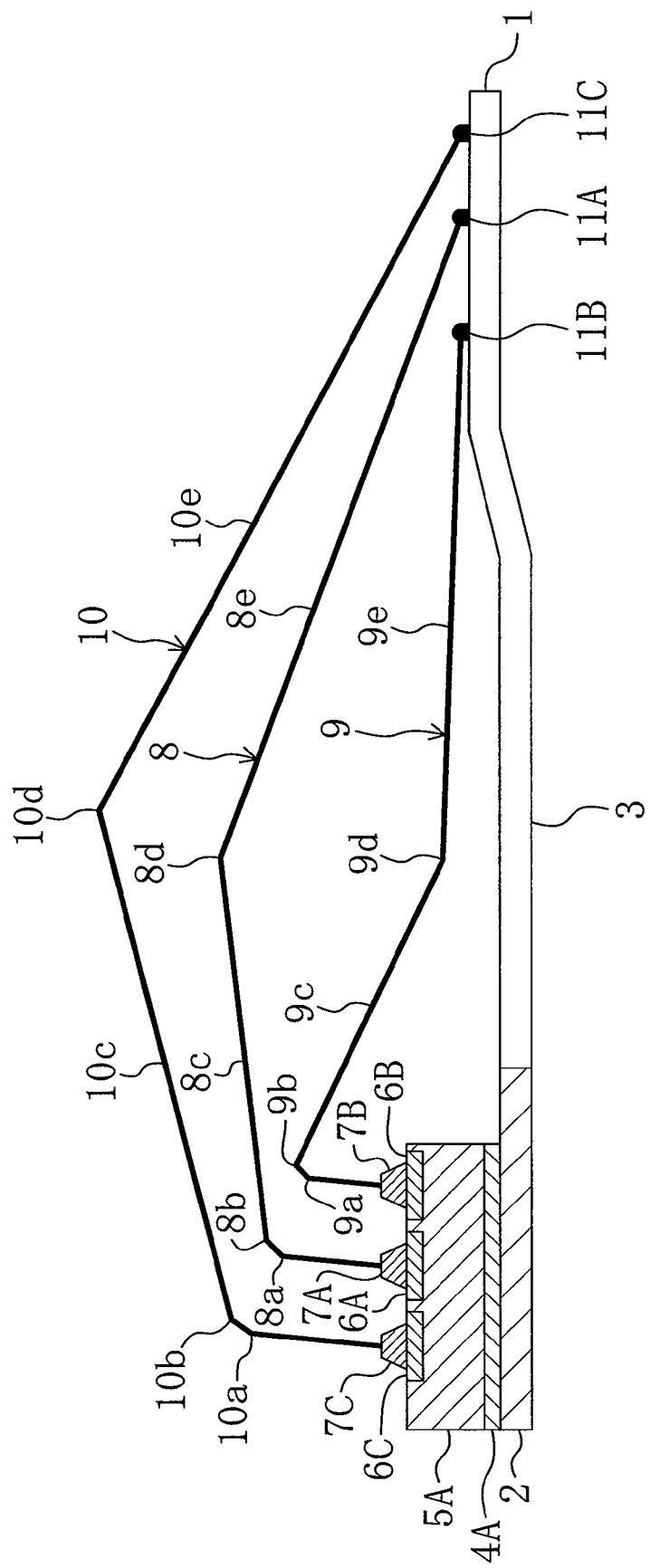
FIG. 6 is a cross-sectional view of a semiconductor device according to a second example embodiment.

FIG. 6 illustrates a cross-sectional structure of the semiconductor device according to the second example embodiment. In FIG. 6, the same reference characters as those shown in FIG. 1 have been used to designate identical elements, and explanation thereof will be omitted.

Differences from the first example embodiment will be described as follows.

As shown in FIG. 6, the first semiconductor chip 5A is secured through the dice bond material 4A on the island 2 in the lead frame 3 having the inner leads 1 and the island 2. The first electrode 6A, the second electrode 6B, and the third electrode 6C formed on an upper surface of the first semiconductor chip 5A, are connected to the inner leads 1 by the first fine metal wire 8, the second fine metal wire 9, and a third fine metal wire 10 adjacent to one another and having different bending shapes.

The third fine metal wire 10 is located above the first fine metal wire 8, and a second bending point 10*d* is located at a position nearer the first semiconductor chip 5A than a position representing about 50% of a distance between the first bond point 7A and a second bond point 11C where the third fine metal wire 10 is connected to the inner lead 1, and the second bending point 10*d* is the highest bending point in the third fine metal wire 10.

The first bond points 7A, 7B and 7C are respectively located at a position higher than the second bond points 11A, 11B, and 11C. An inclination angle of the slope portion 8*e* formed between the second bending point 8*d* and the second bond point 11A of the first fine metal wire 8 is larger than that of the slope portion 9*e* formed between the second bending point 9*d* and the second bond point 11B of the second fine metal wire 9. An inclination angle of a slope portion 10*c* formed between the first bending point 10*b* and the second bending point 10*d* of the third fine metal wire 10 is larger than that of the slope portion 8*c* formed between the first bending point 8*b* and the second bending point 8*d* of the first fine metal wire 8.

A height of the rising portion 8*a* in the first fine metal wire 8 is larger than that of the rising portion 9*a* in the second fine metal wire 9.

The above configuration of the semiconductor device maintains sufficient intervals between the first fine metal wire 8, the second fine metal wire 9, and the third fine metal wire 10 adjacent to one another, thereby preventing the first fine metal wire 8, the second fine metal wire 9, and the third fine metal wire 10 from coming into contact with one another after a step of encapsulation.

Also, the height of the rising portion 8*a* of the first fine metal wire 8 and the height of the rising portion 10*a* of the third fine metal wire 10 can be reduced, and the entire height of the first fine metal wire 8 and the entire height of the third fine metal wire 10 are reduced. Thus, such a configuration can reduce variations of the heights of the bending portions of the first fine metal wire 8 and the third fine metal wire 10, and increase a distance from the uppermost fine metal wire to a surface of a package of an encapsulant (not shown). This allows the metal wires to be less likely to be exposed on the package surface, thereby achieving a semiconductor device having a high quality and providing flexibility in design.

First Modified Example of Second Example Embodiment

A semiconductor device according to a first modified example of the second example embodiment will be described with reference to FIG. 7.

Figure 7:
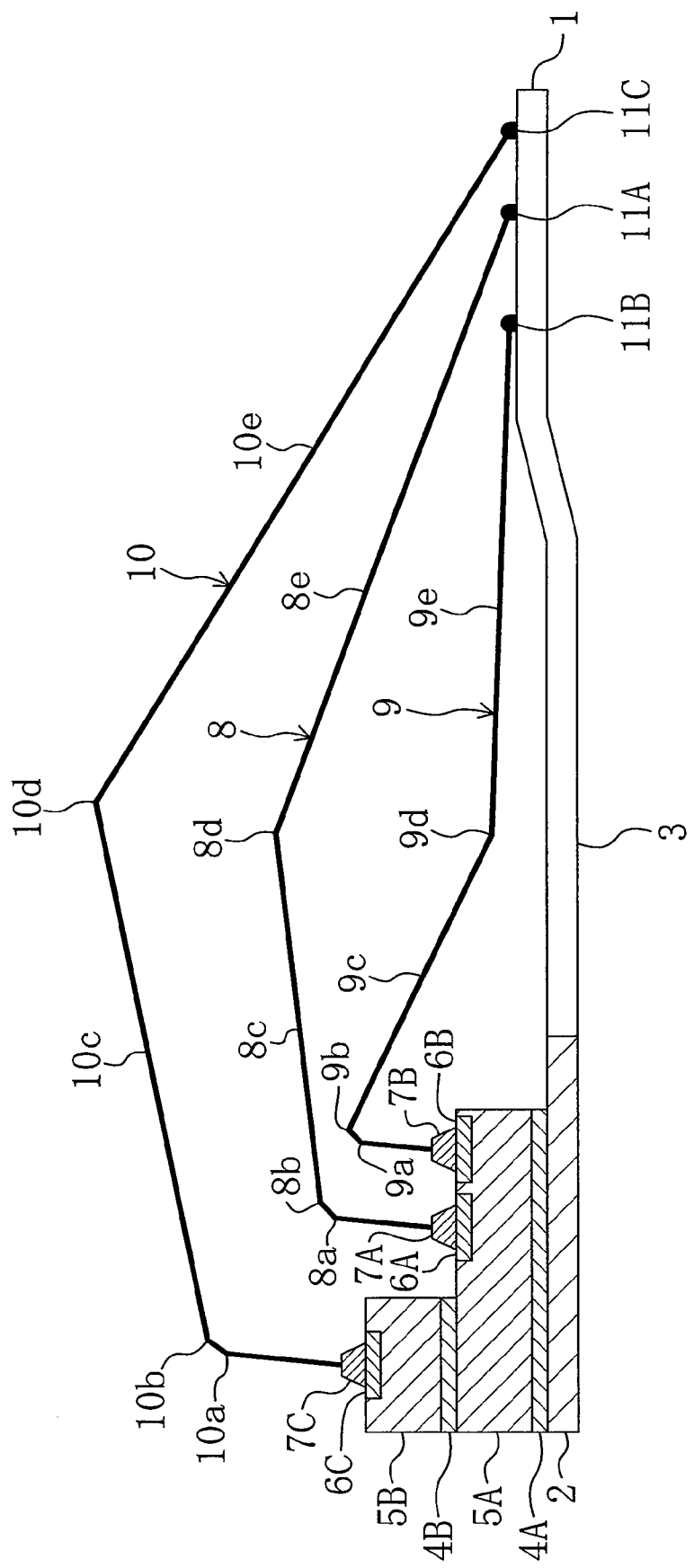
FIG. 7 is a cross-sectional view of a semiconductor device according to a first modified example of the second example embodiment.

FIG. 7 illustrates a cross-sectional structure of the semiconductor device according to the first modified example of the second example embodiment. In FIG. 7, the same reference characters as those shown in FIG. 6 have been used to designate identical elements, and explanation thereof will be omitted.

Differences from the second example embodiment will be described as follows.

As shown in FIG. 7, the first semiconductor chip 5A is secured through the dice bond material 4A on the island 2 in the lead frame 3 having the inner leads 1 and the island 2. The first electrode 6A and the second electrode 6B formed on the upper surface of the first semiconductor chip 5A are connected to the inner leads 1 by the first fine metal wire 8 and the second fine metal wire 9 adjacent to each other and having different bending shapes. The second semiconductor chip 5B is secured through the dice bond material 4B on the upper surface of the first semiconductor chip 5A. The third electrode 6C formed on the upper surface of the second semiconductor chip 5B is connected to the inner lead 1 by the third fine metal wire 10.

The above configuration of the semiconductor device maintain sufficient intervals between the first fine metal wire 8, the second fine metal wire 9, and the third fine metal wire 10 adjacent to one another, thereby preventing the first fine metal wire 8, the second fine metal wire 9, and the third fine metal wire 10 from coming into contact with one another after a step of encapsulation. Also, the height of the rising portion 8a of the first fine metal wire 8 and the height of the rising portion 10a of the third fine metal wire 10 can be reduced, and the entire height of the first fine metal wire 8 and the entire height of the third fine metal wire 10 are reduced. Thus, such a configuration can reduce variations of the heights of the bending portions of the first fine metal wire 8 and the third fine metal wire 10, and increase a distance from the uppermost fine metal wire to a surface of a package of an encapsulant (not shown). This allows the metal wires to be less likely to be exposed on the package surface, thereby achieving a semiconductor device having a high quality and providing flexibility in design.

Third Example Embodiment

A semiconductor device according to a third example embodiment will be described with reference to FIG. 8.

Figure 8:
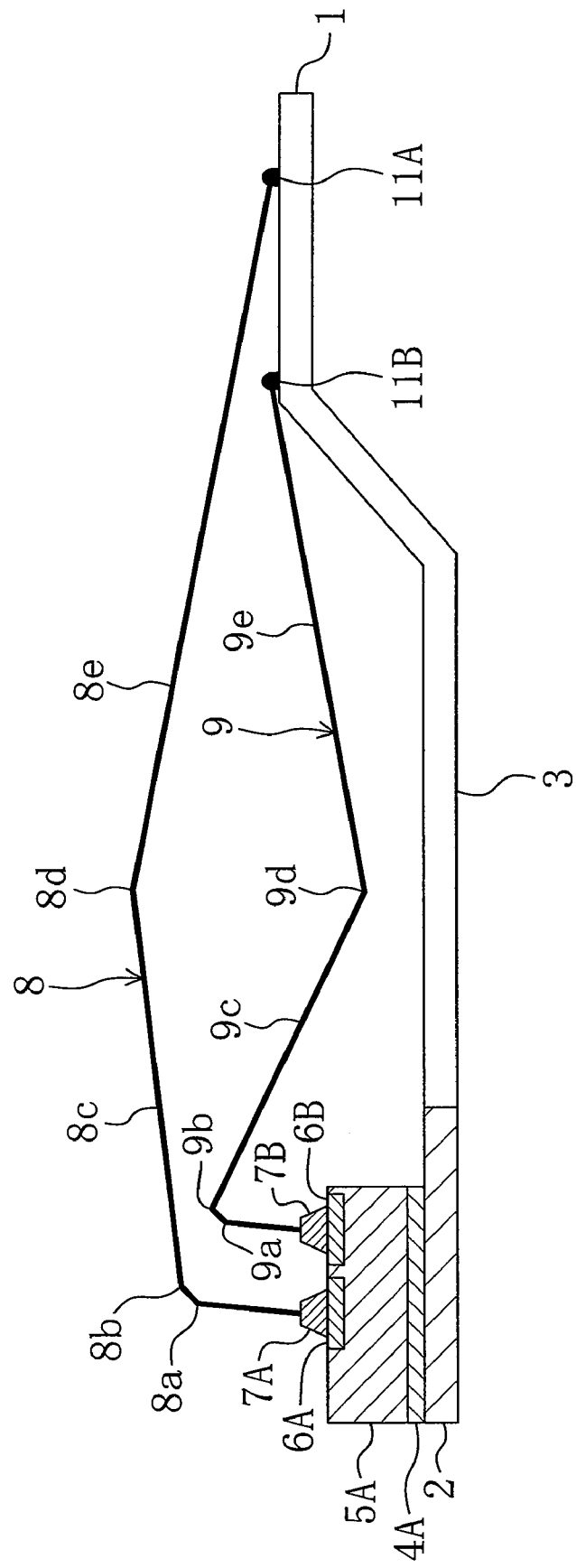
FIG. 8 is a cross-sectional view of a semiconductor device according to a third example embodiment.
Figure 9:
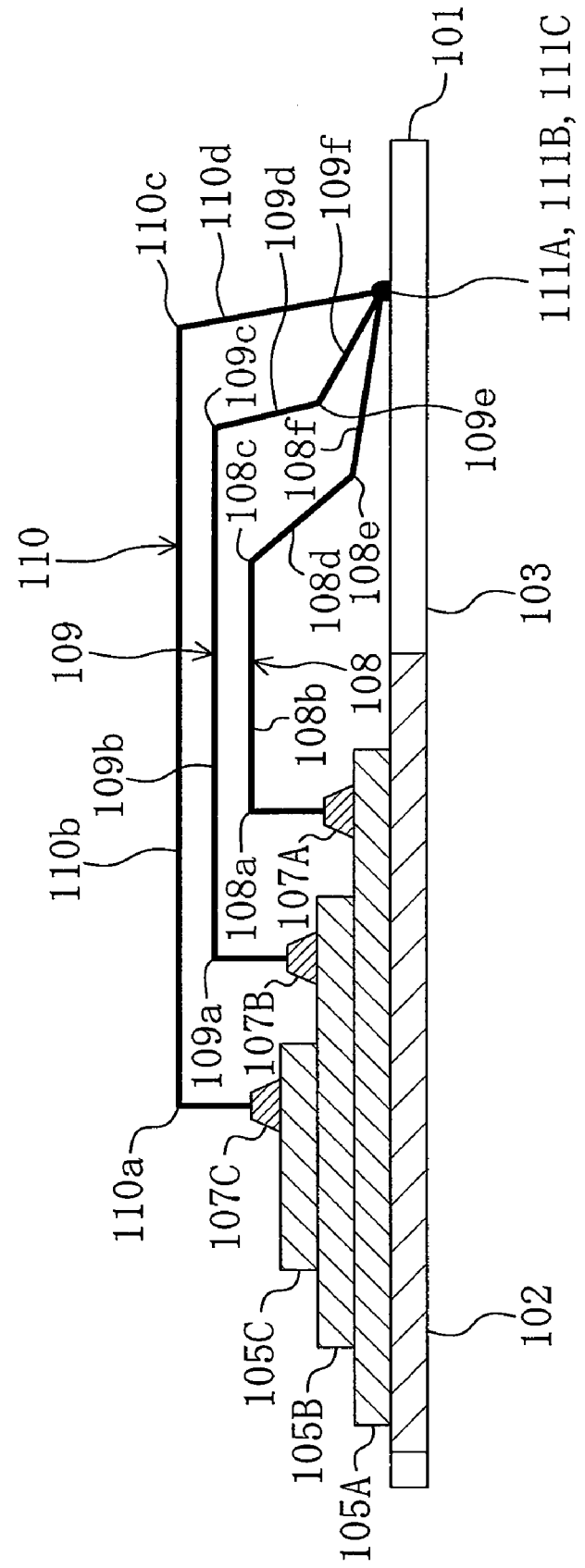
FIG. 9 is a cross-sectional view of a semiconductor device according to a prior art.
Figure 10:
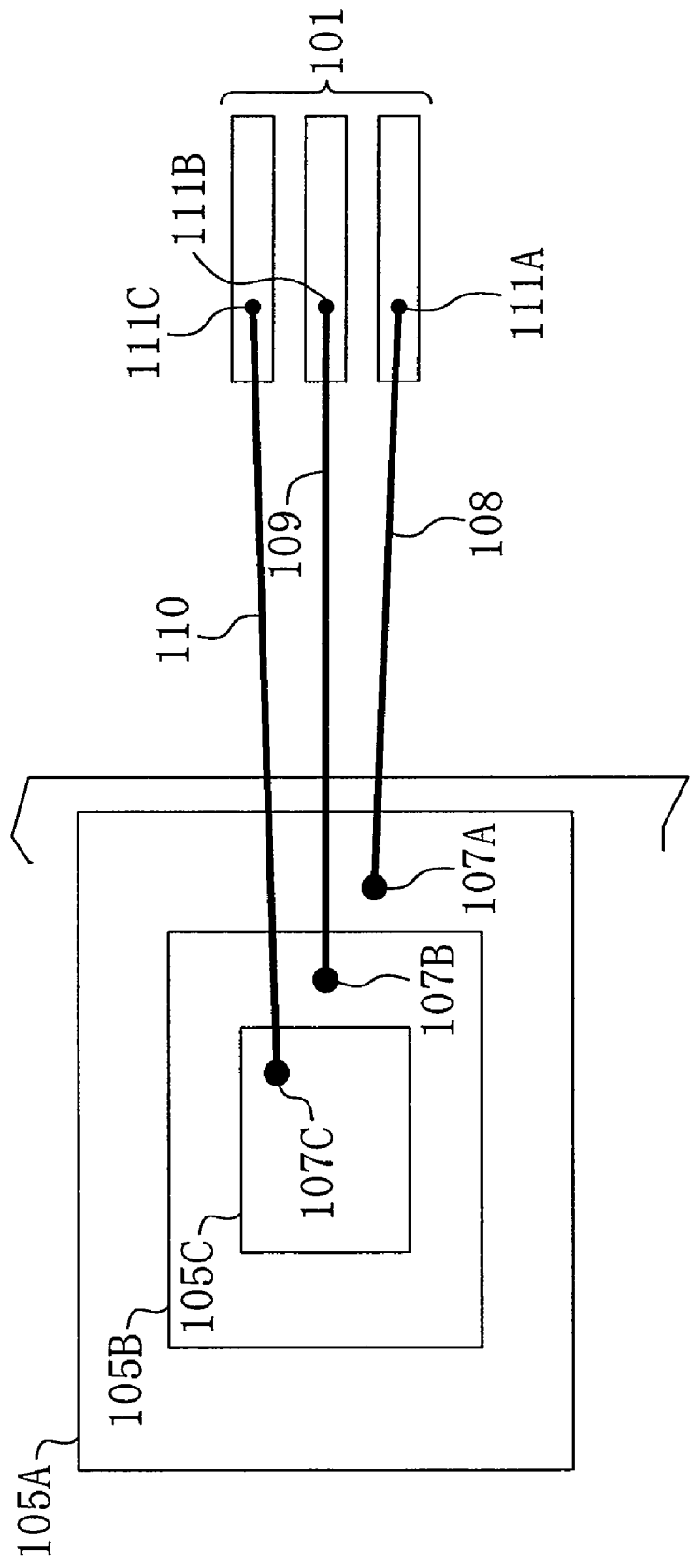
FIG. 10 is a plan view of a semiconductor device according to the prior art.

FIG. 8 illustrates a cross-sectional structure of the semiconductor device according to the third example embodiment. In FIG. 8, the same reference characters as those shown in FIG. 1 have been used to designate identical elements, and explanation thereof will be omitted.

Differences from the first example embodiment will be described as follows.

As shown in FIG. 8, the first bond points 7A and 7B are respectively located at a position lower than the second bond points 11A and 11B of the inner lead 1. With this feature, the slope portion 8e of the first fine metal wire 8 formed between the second bending point 8d and the second bond point 11A has a slope extending downwardly toward the second bond point 11A, and the slope portion 9e of the second fine metal wire 9 formed between the second bending point 9d and the second bond point 11B has a slope extending upwardly toward the second bond point 11B.

A height of the rising portion 8a in the first fine metal wire 8 is larger than that of the rising portion 9a in the second fine metal wire 9.

The above configuration of the semiconductor device maintain the sufficient interval between the first fine metal wire 8 and the second fine metal wire 9 adjacent to each other, thereby preventing the first fine metal wire 8 and the second fine metal wire 9 from coming into contact with each other after a step of encapsulation. Also, the height of the rising portion 8a of the first fine metal wire 8 can be reduced, and the entire height of the first fine metal wire 8 is reduced. Thus, such a configuration can reduce variations of the heights of the bending portions of the first fine metal wire 8, and increase a distance from the uppermost fine metal wire to a surface of a package of an encapsulant (not shown). This allows the metal wires to be less likely to be exposed on the package surface, thereby achieving a semiconductor device having a high quality and providing flexibility in design.

In this way, the semiconductor device according to the present disclosure makes it possible to prevent the interval between the wires adjacent to each other from increasing, and prevent the rising portion from being higher. Therefore, a pitch reduction of the semiconductor chips can be achieved in the semiconductor device, and the device is less likely to be affected by a resin encapsulant, thereby expanding the range of a condition underwhich encapsulation of a resin encapsulant can be performed and preventing the wires from being exposed on a package surface. In particular, the present invention is useful to devices, such as semiconductor devices having a plurality of fine metal wires that connect an electrode on a semiconductor chip to inner leads.

What is claimed is:

1. A semiconductor device comprising:
   a lead frame having an island and an inner lead;
   a semiconductor chip disposed on the island;
   a plurality of electrodes formed on the semiconductor chip; and
   a plurality of wires each connecting each of the electrodes to the inner lead, and each having a plurality of bending points, wherein:
   a first wire of the plurality of the wires has a slope extending upwardly from a first bending point of the first wire toward a second bending point of the first wire, and has a slope extending only downwardly between the second bending point of the first wire and a second connecting point of the first wire, where the first bending point of the first wire is located at an upper end of a rising portion of the first wire rising upwardly from a first connecting point of the first wire on the electrode, and the second bending point of the first wire is the highest bending point in the first wire measured from a surface level of the island, and the first wire connects the inner lead at the second connecting point of the first wire, and
   a second wire of the plurality of the wires has a slope extending downwardly from a first bending point of the second wire toward a second bending point of the second wire, where the first bending point of the second wire is located at an upper end of a rising portion of the second wire rising upwardly from a first connecting point of the second wire on the electrode, and the second bending point of the second wire is the lowest bending point in the second wire measured from the surface level of the island.

2. The device of claim 1, wherein:
   the second bending point of the first wire is located at a position closer to the semiconductor chip than a position representing about 50% of a distance between the first connecting point of the first wire and the second connecting point of the first wire where the first wire is connected to the inner lead, and
   the second bending point of the second wire is located at a position closer to the semiconductor chip than a position representing about 50% of a distance between the first connecting point of the second wire and a second connecting point of the second wire where the second wire is connected to the inner lead.

3. The device of claim 1, wherein the first wire has a third bending point located between the second bending point of the first wire and the second connecting point of the first wire.

4. The device of claim 1, wherein the second wire has a middle bending point located between the second bending point of the second wire and the second connecting point of the second wire.

5. The device of claim 1, wherein:
the first wire has a third bending point located between the second bending point of the first wire and the second connecting point of the first wire,
the second wire has a middle bending point located between the second bending point of the second wire and the second connecting point of the second wire, and
an inclination angle of a portion formed between the second bending point and the third bending point of the first wire is smaller than an inclination angle of a portion formed between the middle bending point and the second bending point of the second wire.

6. The device of claim 1, wherein:
a height of the first connecting points of the first and second wires measured from the surface level of the island is configured to be the same as or larger than that of the second connecting points of the first and second wires, and
an inclination angle of a portion formed between the second bending point and the second connecting point of the first wire is larger than that of a portion formed between the second bending point and the second connecting point of the second wire.

7. The device of claim 1, wherein:
a height of the first connecting points of the first and second wires measured from the surface level of the island is configured to be smaller than that of the second connecting points of the first and second wires, and
the second wire extends upwardly from the second bending point toward the second connecting point.

8. The device of claim 1, wherein at least one pair of the first and second wires of the plurality of the wires are located so as to be adjacent to each other.

9. The device of claim 1, wherein the upper end of the rising portion rising from the first connecting point in the first wire measured from the surface level of the island is higher than or the same as the upper end of the rising portion rising from the first connecting point in the second wire measured from the surface level of the island.

10. The device of claim 1, further comprising multiple ones of the semiconductor chip, wherein the first wire and the second wire are respectively connected to different ones of the multiple ones of the semiconductor chip.

11. The device of claim 1, further comprising:
a third wire that has a different bending shape from the first and second wires, is located above the first wire and extends upwardly from a first bending point of the third wire toward a second bending point of the third wire, where the first bending point of the third wire is located at an upper end of a rising portion of the third wire rising upwardly from a first connecting point of the third wire on the electrode, wherein:
the second bending point of the third wire is located at a position closer to the semiconductor chip than a position representing about 50% of a distance between the first connecting point and a second connecting point of the third wire, the third wire connecting the inner lead at the second connecting point of the third wire,
the second bending point of the third wire is the highest bending point in the third wire measured from the surface level of the island, and
the second bending point of the third wire is located at a position closer to the inner lead than the second bending point of the first wire.

12. The device of claim 11, further comprising multiple ones of the semiconductor chip on the island, wherein
the first wire and the third wire are respectively connected to different ones of the multiple ones of the semiconductor chip.

13. The device of claim 1, wherein from the second bending point of the second wire, the second wire inclines only downwardly toward a second connecting point of the second wire, the second wire connecting the inner lead at the second connecting point of the second wire.

14. The device of claim 1, wherein:
the first connecting point of the first wire is formed on the semiconductor chip,
the second connecting point of the first wire is formed on the inner lead,
the first connecting point of the second wire is formed on the semiconductor chip, and
the second connecting point of the second wire is formed on the inner lead.

15. The device of claim 1, wherein the surface level of the island is located at a different height from a surface level of the inner lead.

16. The device of claim 10, wherein the multiple ones of the semiconductor chip are disposed on a same side of the island.

* * * * *